United States Patent
Sano et al.

(10) Patent No.: US 10,594,288 B2
(45) Date of Patent: Mar. 17, 2020

(54) MULTILAYER RESONANT CIRCUIT COMPONENT, PACKAGED MULTILAYER RESONANT CIRCUIT COMPONENT, AND MULTILAYER RESONANT CIRCUIT COMPONENT MANUFACTURING METHOD

(71) Applicant: Murata Manufacturing Co., Ltd., Kyoto-fu (JP)

(72) Inventors: Rikiya Sano, Nagaokakyo (JP); Shimpei Tanabe, Nagaokakyo (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 0 days.

(21) Appl. No.: 16/122,812

(22) Filed: Sep. 5, 2018

(65) Prior Publication Data
US 2019/0081608 A1 Mar. 14, 2019

(30) Foreign Application Priority Data
Sep. 8, 2017 (JP) .................................. 2017-172852

(51) Int. Cl.
H03H 7/01 (2006.01)
H01F 17/00 (2006.01)
(Continued)

(52) U.S. Cl.
CPC ....... *H03H 7/0115* (2013.01); *H01F 17/0013* (2013.01); *H01F 17/0033* (2013.01);
(Continued)

(58) Field of Classification Search
CPC ......... H03H 2001/0085; H03H 7/0115; H03H 7/1741
(Continued)

(56) References Cited

U.S. PATENT DOCUMENTS 7,176,776 B1 * 2/2007 Tantwai ................ H01P 1/2135
333/204
2008/0254968 A1 * 10/2008 Kakuda ................ C04B 35/465
501/137
(Continued)

FOREIGN PATENT DOCUMENTS

JP   S63-12119 A    1/1988
JP   H04-284606 A   10/1992
(Continued)

OTHER PUBLICATIONS

An Office Action; "Notification of Reasons for Refusal," Mailed by the Japanese Patent Office dated Dec. 24, 2019, which corresponds to Japanese Patent Application No. 2017-172852 and is related to U.S. Appl. No. 16/122,812; with English language translation.

*Primary Examiner* — Rakesh B Patel

(74) *Attorney, Agent, or Firm* — Studebaker & Brackett PC

(57) ABSTRACT

A multilayer resonant circuit component includes a multilayer body in which first electrode layers, which are provided with both coil patterns and capacitor patterns that constitute an LC circuit, are stacked with first insulator layers interposed therebetween. The multilayer body further includes, stacked together with a second insulator layer, at least one of the following: one or more second electrode layers that each include only a capacitor pattern; and a third electrode layer that includes only a coil pattern.

16 Claims, 5 Drawing Sheets

(51) Int. Cl.
  *H05K 1/16*   (2006.01)
  *H01G 4/005*  (2006.01)
  *H01G 4/40*   (2006.01)
  *H01G 4/012*  (2006.01)
  *H03H 1/00*   (2006.01)
  *H01G 4/30*   (2006.01)
(52) U.S. Cl.
  CPC ............ *H01G 4/005* (2013.01); *H01G 4/012* (2013.01); *H01G 4/40* (2013.01); *H03H 7/1741* (2013.01); *H05K 1/162* (2013.01); *H05K 1/165* (2013.01); *H01G 4/30* (2013.01); *H03H 2001/0085* (2013.01)
(58) Field of Classification Search
  USPC .................................................. 333/175, 185
  See application file for complete search history.

(56) References Cited

U.S. PATENT DOCUMENTS

| | | | |
|---|---|---|---|
| 2009/0033439 | A1* | 2/2009 | Igarashi .............. H01P 1/20345 333/185 |
| 2017/0103846 | A1 | 4/2017 | Yoneda |
| 2017/0229247 | A1 | 8/2017 | Yoneda |

FOREIGN PATENT DOCUMENTS

| | | |
|---|---|---|
| JP | H05-190379 A | 7/1993 |
| JP | H10-270249 A | 10/1998 |
| JP | 2001-134732 A | 5/2001 |
| JP | 2001-345661 A | 12/2001 |
| JP | 2017-143116 A | 8/2017 |
| WO | 2016-006542 A1 | 1/2016 |

* cited by examiner

MULTILAYER RESONANT CIRCUIT COMPONENT, PACKAGED MULTILAYER RESONANT CIRCUIT COMPONENT, AND MULTILAYER RESONANT CIRCUIT COMPONENT MANUFACTURING METHOD

CROSS-REFERENCE TO RELATED APPLICATION

This application claims benefit of priority to Japanese Patent Application No. 2017-172852, filed Sep. 8, 2017, the entire content of which is incorporated herein by reference.

BACKGROUND

Technical Field

The present disclosure relates to a multilayer resonant circuit component that is formed by stacking electrode layers, which are for creating a coil and a capacitor, and insulator layers on top of one another. The present disclosure further relates to a packaged multilayer resonant circuit component, and relates to a multilayer resonant circuit component manufacturing method.

Background Art

In recent years, together with the trend of carrier frequencies of communication devices such as cellular phones to become ever higher, large numbers of LC resonant circuits that handle frequencies in the GHz band are being used in the signal transmission units and signal reception units of such devices.

An example of such an LC resonant circuit is a parallel resonant circuit in which an inductance L and a capacitance C are connected in parallel with each other as illustrated in FIG. 5. In order to form such an LC resonant circuit, a coil component and a capacitor component may be connected in parallel with each other on a substrate. In addition, in Japanese Unexamined Patent Application Publication No. 2001-134732, a multilayer resonant circuit component is proposed in which a plurality of insulator layers and electrode layers are stacked on top of one another and in which each electrode layer includes both a coil pattern and a capacitor pattern.

Generally, a resonant frequency $f_0$ of an LC resonant circuit is expressed by formula (1), an inductance L produced by a coil 1 is expressed by formula (2), and a capacitance C produced by a capacitor 2 is expressed by formula (3).

$$f_0 = \frac{1}{2\pi\sqrt{LC}} \quad (1)$$

$$L = \frac{k\mu S_L N_L^2}{l} \quad (2)$$

k: Nagaoka coefficient
$S_L$: coil sectional area
l: coil length
μ: relative permeability of magnetic core
$N_L$: number of turns of coil $$C = \frac{\varepsilon S_c N_c}{d} \quad (3)$$

ε: relative permittivity of dielectric layer
$N_C$: number of stacked capacitor electrodes
d: inter-electrode distance
$S_C$: facing electrode area In the multilayer resonant circuit component disclosed in Japanese Unexamined Patent Application Publication No. 2001-134732, the coil patterns and the capacitor patterns are formed in the same electrode layers, and therefore the coil 1 and the capacitor 2 in FIG. 5 both experience similar processing variations. For example, when the thickness of an insulator layer between certain electrode layers varies, an inter-electrode distance d varies in the capacitor 2 and a coil length l varies in the coil 1. In addition, for example, when an electrode area (wiring width) of a certain electrode layer varies, a facing electrode area $S_C$ varies in the capacitor 2 and a coil sectional area $S_L$ varies in the coil 1. In this case, it is clear from formulas (1), (2), and (3) that the inter-electrode distance d and the coil length l, the facing electrode area $S_C$ and the coil sectional area $S_L$ affect the resonant frequency $f_0$ in the same direction.

Therefore, for example, if the thickness of an insulator layer becomes larger, the inductance L and the capacitance C both become smaller and the resonant frequency $f_0$ becomes larger, whereas if the electrode area of an electrode layer becomes larger, the inductance L and the capacitance C both become larger and the resonant frequency $f_0$ becomes smaller. Thus, when a coil pattern and a capacitor pattern are formed in the same electrode layer, processing variations in these patterns result in the resonant frequency varying in the same direction, and therefore the variation width of the resonant frequency $f_0$ is increased.

SUMMARY

The present disclosure was made in light of the above-described circumstances, and provide a multilayer resonant circuit component, a packaged multilayer resonant circuit component, and a multilayer resonant circuit component manufacturing method in which variations in a resonant frequency are reduced.

A multilayer resonant circuit component that solves the above-described problem includes a multilayer body in which first electrode layers that each include both a coil pattern and a capacitor pattern that form an LC resonant circuit are stacked with a first insulator layer interposed therebetween. At least either one of a second electrode layer that includes only a capacitor pattern located at a position facing the capacitor patterns of the first electrode layers and a third electrode layer that includes only a coil pattern, which is electrically connected to the coil patterns of the first electrode layers, is stacked together with a second insulator layer. With this configuration, variations in the resonant frequency of the LC resonant circuit are reduced.

In addition, in the multilayer resonant circuit component, it is preferable that a thickness of the second insulator layer be different from a thickness of the first insulator layer interposed between the first electrode layers. With this configuration, a capacitance generated by the capacitor patterns of the first and second electrode layers and an inductance generated by the coil patterns of the first and third electrode layers are adjusting by using the thickness of the second insulator layer.

Furthermore, in the multilayer resonant circuit component, it is preferable that the capacitor pattern of the second electrode layer have a shape that is different from a shape of the capacitor patterns of the first electrode layers. With this configuration, the capacitance generated by the first and second electrode layers is adjusted with a higher degree of freedom by using the second electrode layer.

In addition, in the multilayer resonant circuit component, it is preferable that there be a plurality of the second electrode layers and that shapes of the capacitor patterns of the second electrode layers be different from each other. With this configuration, the degree of freedom with respect to the capacitance generated by the capacitor patterns of the first and second electrode layers is increased.

In addition, in the multilayer resonant circuit component, it is preferable that a thickness of the second insulator layer be around 5 μm to 15 μm. With this configuration, short circuits between electrode layers due to an insulator layer not being thick enough and a reduction in connection reliability between electrode layers due to an insulator layer being too thick are prevented.

Furthermore, in the multilayer resonant circuit component, it is preferable that a ratio of a thickness of the second electrode layer to a thickness of the second insulator layer or a ratio of a thickness of the third electrode layer to a thickness of the second insulator layer be set to be in a range of around 0.3 to 4.0.

With this configuration, an electrode layer and an insulator layer are prevented from peeling away from each other due to there being a difference in the coefficient of contraction between the insulator layer and the conductor layer when the temperature changes by setting the thickness ratio to be less than or equal to around 4.0. In addition, a reduction in the reliability of a connection between electrode layers due to an insulator layer being too thick is prevented by setting the thickness ratio to be greater than or equal to around 0.3.

Furthermore, in the multilayer resonant circuit component, it is preferable that the first to third electrode layers each further include a pair of outer conductor patterns that are commonly exposed at least one surface of the multilayer body, that the outer conductor patterns be substantially L shaped when viewed in a stacking direction of the multilayer body and be electrically connected to each other to form outer conductors, that the coil patterns be electrically connected to each other and form a coil conductor having a coil axis that is substantially parallel to the one surface, and that the outer conductors be electrically connected to an end portion of the coil conductor and to the capacitor patterns.

With this configuration, since the coil axis in the multilayer body is parallel to a mounting substrate and a mounting surface, the efficiency with which the inductance is acquired is improved. In addition, the amount of magnetic flux obstructed by the outer conductors is reduced, and therefore the occurrence of eddy current loss is reduced and stray capacitances between the coil conductor and the outer conductors are also reduced.

A packaged multilayer resonant circuit component that solves the above-described problem includes any one of the multilayer resonant circuit components described above; and a packaging member that houses the multilayer resonant circuit component. When $f_0$ represents an average value of resonant frequencies of a plurality of the multilayer resonant circuit components and σ represents a standard deviation, 5σ is less than or equal to around 5% of $f_0$. With this configuration, multilayer resonant circuit components are obtained for which variations in the resonant frequency are reduced to be less than or equal to a fixed level.

A multilayer resonant circuit component manufacturing method that solves the above-described problem includes stacking first electrode layers, which each include both a coil pattern and a capacitor pattern that form an LC resonant circuit, with a first insulator layer interposed therebetween; stacking at least either of a second electrode layer that includes only a capacitor pattern and a third electrode layer that includes only a coil pattern, which is electrically connected to the coil patterns of the first electrode layers, together with a second insulator layer; and adjusting at least any one of a capacitance of a capacitor formed by the capacitor pattern of the second electrode layer, an inductance of a coil formed by the third electrode layer, and a thickness of the second insulator layer so as to cancel out a variation amount of an inductance of the coil patterns of the first electrode layers and a variation amount of a capacitance generated by the capacitor patterns of the first electrode layers arising from variations in processing of the first electrode layers and the first insulating layer. With this method, variations in an inductance and a capacitance that form an LC resonant circuit are reduced.

With the multilayer resonant circuit component, the packaged multilayer resonant circuit component, and the multilayer resonant circuit component manufacturing method according to embodiments of the present disclosure, variations in resonant frequency can be reduced.

Other features, elements, characteristics and advantages of the present disclosure will become more apparent from the following detailed description of preferred embodiments of the present disclosure with reference to the attached drawings.

DETAILED DESCRIPTION

Figure 1:
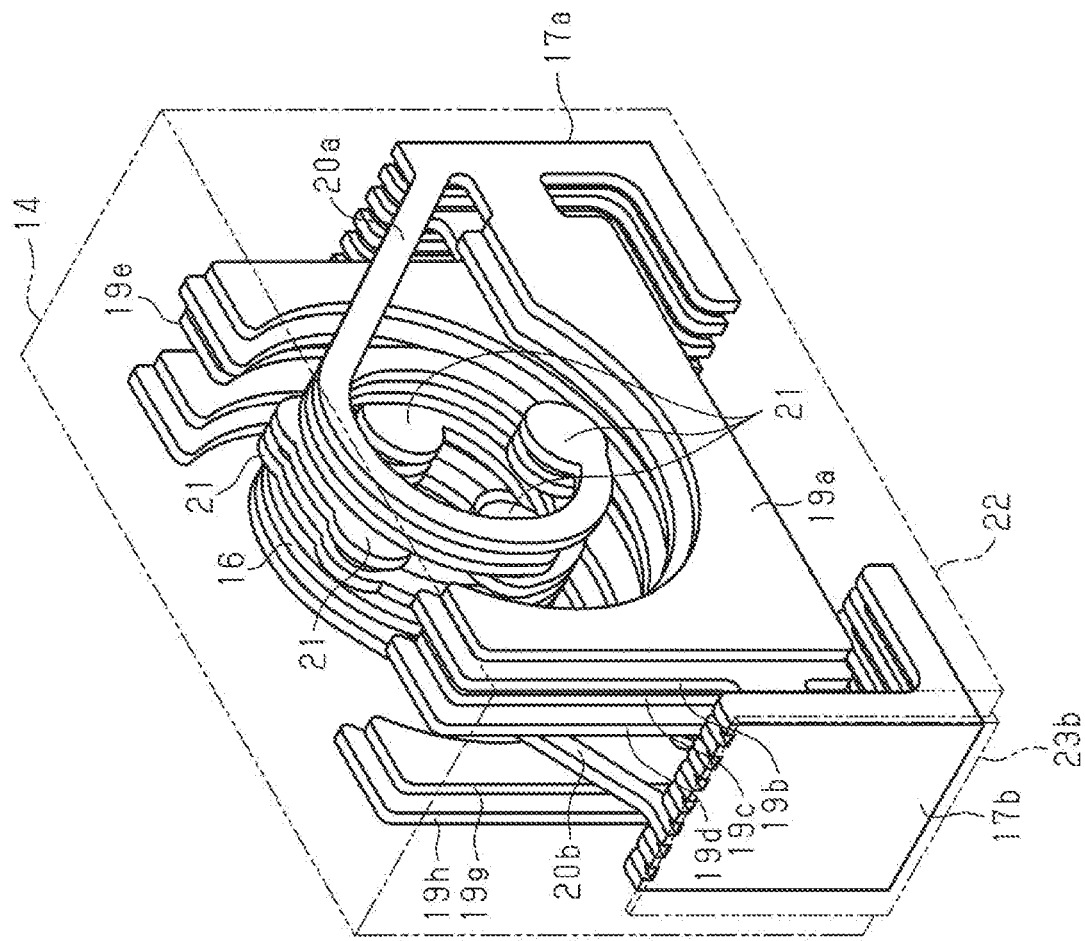
FIG. 1 is a perspective view illustrating a multilayer resonant circuit component of an embodiment.

Hereafter, an embodiment in which the present disclosure is implemented will be described while referring to the drawings.

Figure 2:
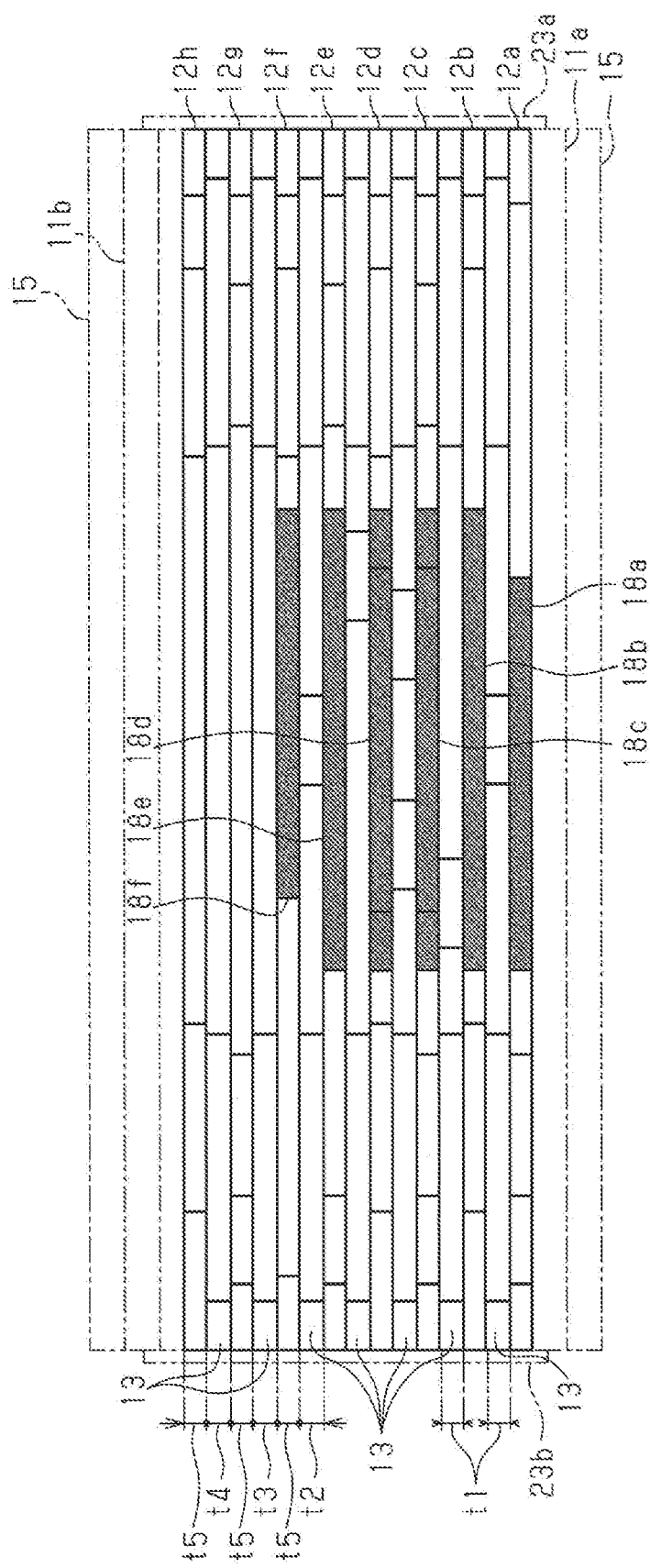
FIG. 2 is a plan view illustrating electrode layers and insulator layers of the multilayer resonant circuit component.
Figure 3:
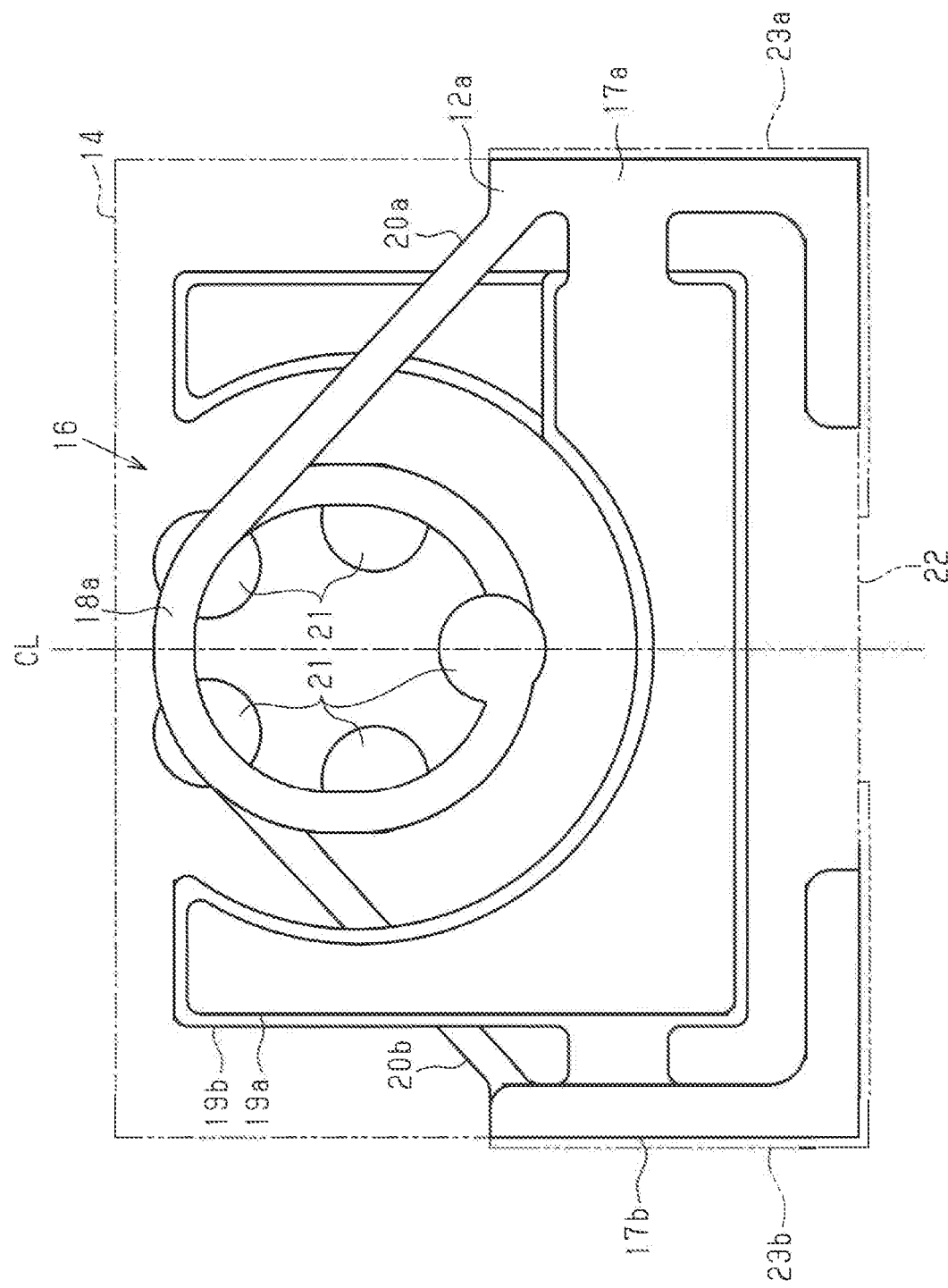
FIG. 3 is a front view illustrating an electrode layer of the multilayer resonant circuit component.
Figure 4:
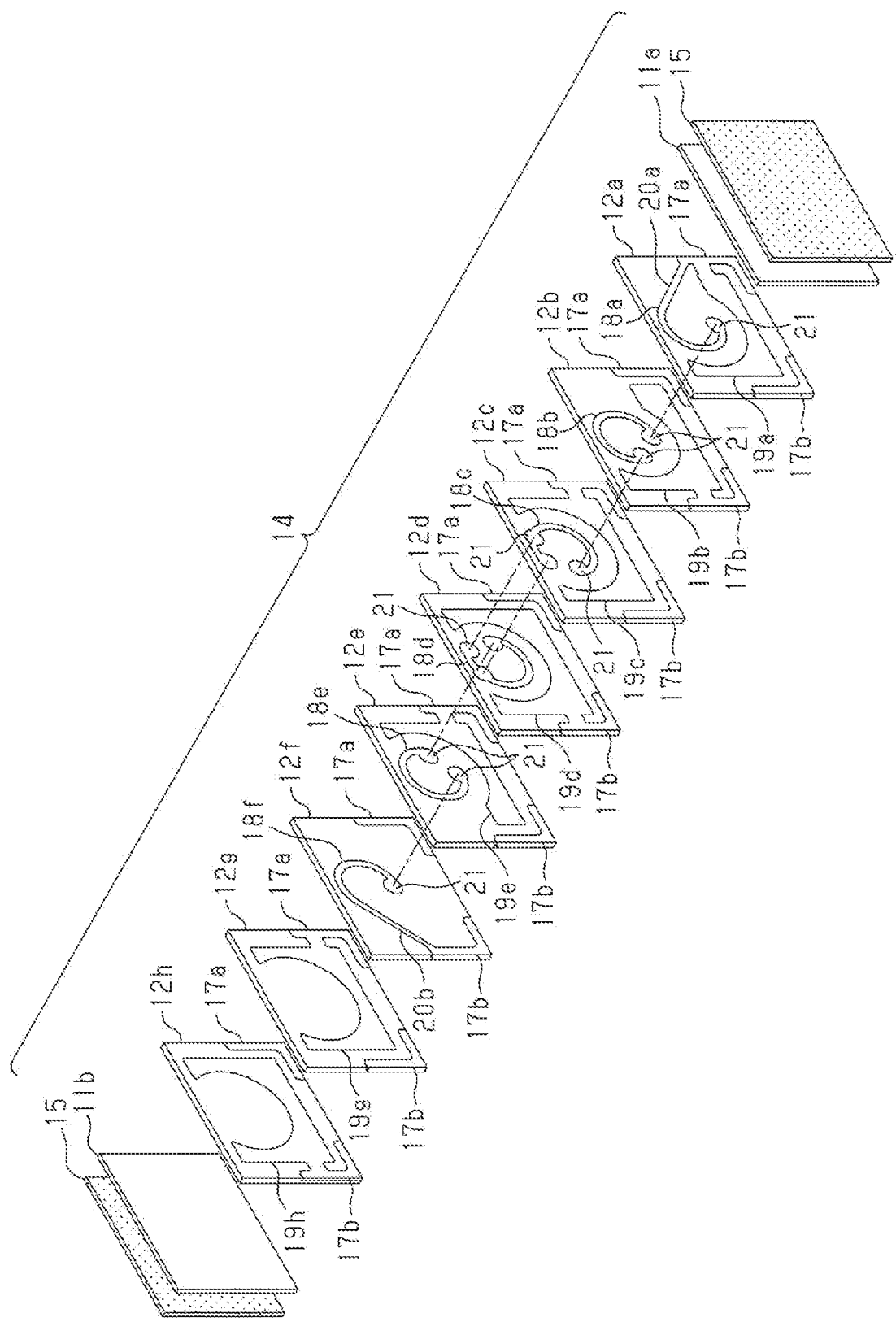
FIG. 4 is a perspective view illustrating an electrode layer of the multilayer resonant circuit component.
Figure 5:
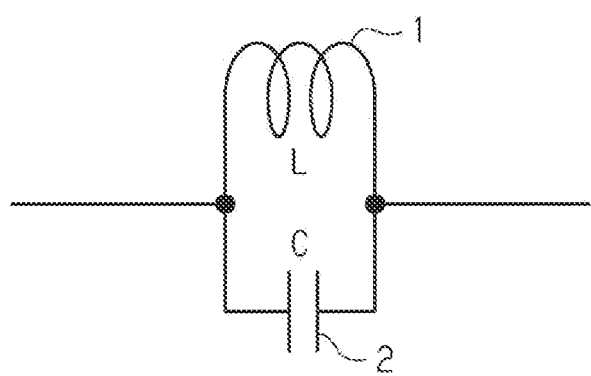
FIG. 5 is an equivalent circuit diagram of an LC resonant circuit formed by the multilayer resonant circuit component.

In a multilayer resonant circuit component illustrated in FIGS. 1 to 4, a multilayer body 14, which is obtained by alternately stacking a large number of electrode layers 12a to 12h and insulator layers 13 on top of one another, is stacked between a pair of exterior insulator layers 11a and 11b (refer to FIGS. 2 and 4). Side surface recognition markers 15 are formed on the surfaces of the exterior insulator layers 11a and 11b.

As illustrated in FIG. 4, coil patterns 18a to 18f, which are for forming a coil conductor 16, are respectively formed in the electrode layers 12a to 12f and outer conductors 17a and 17b, which each have a substantially L-shaped cross section, are formed so as to extend from both sides of each of the coil patterns 18a to 18f in the radial direction, in other words, from both side surfaces of the multilayer body 14 in the longitudinal direction onto a lower surface of the multilayer body 14 (mounting surface 22, refer to FIG. 3). Furthermore, capacitor patterns 19a to 19e, 19g, and 19h are respectively formed in the electrode layers 12a to 12e and the electrode layers 12g and 12h.

Then, the multilayer body 14 is formed by stacking the electrode layers 12a to 12h and the insulator layers 13 in order from the one exterior insulator layer 11a to the other exterior insulator layer 11b with the exterior insulator layers 11b being stacked last. The outer conductors 17a and 17b are stacked in the same layers as the electrode layers 12a to 12h.

The coil patterns 18a to 18f, the capacitor patterns 19a to 19e, 19g, and 19h, and the outer conductors 17a and 17b are formed by patterning a conductive paste composed of a good conductor having Ag, Cu, or the like as a main component and then firing the conductive paste. The insulator layers 13 between the electrode layers 12a to 12h and the insulator layers between the individual conductive paste parts are formed by firing an insulating paste having borosilicate glass as a main component.

In the actual process, a mother multilayer body will be created by stacking a large number of multilayer bodies 14 in an arrayed manner on a substrate, and then the mother multilayer body will be cut into individual multilayer bodies 14 using a dicing machine. At this time, as illustrated in FIG. 1, the outer conductors 17a and 17b will become exposed at the side surfaces of the multilayer body 14 and at both sides of the mounting surface of the multilayer body 14.

Next, the multilayer body 14 is fired under prescribed conditions. After that, the multilayer body 14 is subjected to barrel treatment (barrel polishing) and then outer electrodes 23a and 23b are formed by applying Sn plating or Ni plating having a thickness of around 2 μm to 10 μm on the surfaces of the outer conductors 17a and 17b.

As illustrated in FIG. 4, the coil patterns 18a to 18e and the capacitor patterns 19a to 19e are respectively formed in the electrode layers 12a to 12e among the electrode layers 12a to 12h. In the electrode layer 12f, the coil pattern 18f is formed and a capacitor pattern is not formed.

The coil pattern 18a is connected to the corresponding outer conductor 17a via an extending electrode 20a and the coil pattern 18f is connected to the corresponding outer conductor 17b via an extending electrode 20b. In addition, the coil patterns 18a to 18f are connected to each other through vias 21. Therefore, a coil, which is for generating a prescribed inductance, is formed by the coil patterns 18a to 18f.

The capacitor patterns 19a to 19e are connected to the outer conductors 17a and 17b in an alternating manner. The capacitor patterns 19g and 19h are formed in the electrode layers 12g and 12h. The capacitor pattern 19g is connected to the outer conductor 17a and the capacitor pattern 19h is connected to the outer conductor 17b. In addition, the capacitor patterns 19g and 19h have different outer diameter shapes, and in this embodiment, the capacitor pattern 19h is formed so as to have a larger area than the capacitor pattern 19g. A capacitor, which is for generating a prescribed capacitance, is formed by the capacitor patterns 19a to 19e, 19g, and 19h.

As illustrated in FIG. 3, the thus-configured coil patterns 18a to 18f and capacitor patterns 19a to 19e, 19g, and 19h are formed so as to be symmetrical about a central line CL that is perpendicular to the mounting surface 22, and even if the connection relationship between the outer electrode 23a and 23b and substrate wiring lines on the mounting surface 22 is reversed, the same characteristics are obtained.

The insulator layers 13 stacked between the electrode layers 12a to 12e are stacked such that the thicknesses of the insulator layers 13 are set to the same thickness t1. In addition, the insulator layers 13 stacked between the electrode layers 12e to 12h are stacked such that thicknesses t2 to t4 of the insulator layers 13 are set to different values from the thickness t1. The set values are set so as to make variations in a resonant frequency $f_0$ resulting from processing variations smaller. The thicknesses t2 to t4 and the thickness t1 do not necessarily have to have different values.

Next, the operation of the thus-configured multilayer resonant circuit component will be described.

The mounting surface 22 of the multilayer resonant circuit component is mounted on a mounting substrate (not illustrated) and the outer electrodes 23a and 23b of the multilayer resonant circuit component are electrically connected to the mounting substrate. Thus, the coil axis is parallel to the mounting substrate, and therefore the interference acting on magnetic flux passing through the coil conductor due to the mounting substrate is small. Therefore, the efficiency with which inductance is acquired using the coil conductor 16 is improved.

Taking the stacking process and the firing process used for the insulator layers 13 and the electrode layers 12a to 12h into consideration, when $f_0$ represents the average value of the resonant frequencies and σ represents the standard deviation, 5σ almost always exceeds around ±5% of $f_0$ as the range of variation for a fixed number or more of multilayer resonant circuit components.

In contrast, in this embodiment, the stacking conditions of the electrode layers 12f to 12h are adjusted in order to cancel out variations in the resonant frequency $f_0$ that arise from variations in the stacking process in the electrode layers 12a to 12e. Therefore, adjustments can be made such that 5σ falls within around ±5% of $f_0$ and multilayer resonant circuit components can be provided in which variations in the resonant frequency are reduced. For example, in the case where a plurality of multilayer resonant circuit components are packaged in a taping reel, 5σ can be made to be less than or equal to around 5% of $f_0$ for packaged multilayer resonant circuit components of one reel section, where $f_0$ represents the average value of the resonant frequencies and σ represents the standard deviation.

Specifically, an amount of variation between the resonant frequency $f_0$ and the desired resonant frequency in a state where the electrode layers 12a to 12e and the insulator layers 13 interposed between the electrode layers 12a to 12e are stacked on top of one another is obtained by simulation. Then, the conditions in the process of stacking the electrode layers 12f to 12h and the insulator layers 13 interposed therebetween may be set in order to cancel out this amount of variation.

For example, a multilayer resonant circuit component may be provided in which the multilayer body 14 has outer diameter dimensions of around 0.4 mm×0.2 mm×0.3 mm, the inductance L of the coil is around 2.0 nH, the capacitance C of the capacitor is 2.0 pf, and that aims to realize a resonant frequency $f_0$ of around 2.4 GHz.

The insulator layers 13 between the electrode layers 12f to 12h are stacked such that the thicknesses t2 to t4 thereof are around 5 μm to 15 μm. A ratio t5/t2–t4 between the thickness t5 of the electrode layers 12f to 12h and the thicknesses t2 to t4 of the insulator layers 13 between the electrode layers 12f to 12h is set to around 0.3 to 4.0.

By setting the thicknesses t2 to t4 of the insulator layers 13 between the electrode layers 12f to 12h to be around 5 μm to 15 μm, short circuits between the electrode layers 12f to 12h due to the insulator layers 13 being insufficiently thick is prevented and a situation in which the vias 21 are insufficiently filled with a conductor due to the insulator layers 13 being too thick is prevented.

In addition, by setting the ratio between the thickness t5 and the thicknesses t2 to t4 to be less than or equal to around 4.0, a situation in which an electrode layer and an insulator layer peel away from each other when the temperature falls after firing due to a difference in the coefficient of contraction between the insulator layer and the conductor layer is prevented. Furthermore, a situation in which the vias 21 are insufficiently filled with a conductor due to the insulator layers 13 being too thick is prevented by setting the ratio between the thickness t5 and the thicknesses t2 to t4 to be greater than or equal to around 0.3. The thicknesses t1 to t5 are post-firing thicknesses.

The following effects can be obtained with the thus-configured multilayer resonant circuit component.

(1) Since the electrode layer 12f that has only the coil pattern 18f formed therein and the electrode layers 12g and 12h that have only the capacitor patterns 19g and 19h formed therein are formed, the occurrence of variations in the inductance L and the capacitance C that cause the resonant frequency $f_0$ to vary in the same direction can be suppressed even in the case where the thicknesses of the insulator layers 13 between the electrode layers 12f to 12h vary. Therefore, the amount of variation from the desired resonant frequency can be suppressed.

(2) The inductance L and the capacitance C can be respectively individually adjusted using the electrode layer 12f in which only the coil pattern 18f is formed and the electrode layers 12g and 12h in which only the capacitor patterns 19g and 19h are formed.

(3) The capacitance C can be adjusted by adjusting the areas of the capacitor patterns 19g and 19h, which face each other, in the electrode layers 12g and 12h.

(4) The insulator layers 13 between the electrode layers 12f to 12h are given different thicknesses from the insulator layers between the rest of the electrode layers, and therefore the inductance L can be finely adjusted using the electrode layer 12f and the capacitance C can be finely adjusted using the electrode layers 12g and 12h.

(5) After checking the variations in the inductance L and the capacitance C generated by the electrode layers 12a to 12e, the electrode layers 12f to 12h can be formed in such a way as to cancel out these variations. Therefore, the accuracy with which the desired resonant frequency $f_0$ is acquired can be improved.

(6) By setting the thicknesses t2 to t4 of the insulator layers 13 between the electrode layers 12f to 12h to be around 5 µm to 15 µm, short circuits between the electrode layers 12f to 12h due to the insulator layers 13 being insufficiently thick and a situation in which the vias 21 are insufficiently filled with a conductor due to the insulator layers 13 being too thick can be prevented.

(7) A situation in which an electrode layer and an insulator layer peel away from each other when the temperature falls after the firing due to a difference in the coefficient of contraction between the insulator layer and the conductor layer is prevented by setting the ratio between the thickness t5 of the electrode layers 12f to 12h and the thicknesses t2 to t4 of the insulator layers 13 between the electrode layers 12f to 12h to be less than or equal to around 4.0. Furthermore, a situation in which the vias 21 are insufficiently filled with a conductor due to the insulator layers 13 being too thick can be prevented by setting the ratio between the thickness t5 and the thicknesses t2 to t4 to be greater than or equal to around 0.3.

(8) Multilayer resonant circuit components can be formed among which variations in the resonant frequency $f_0$ caused by variations in the stacking process are $5\sigma \leq 5\%$.

(9) In the multilayer body 14, which is mounted on a mounting substrate using the outer electrodes 23a and 23b, the coil axis is parallel to the mounting substrate and the mounting surface 22, and therefore the efficiency with which the inductance is acquired is improved. Therefore, the Q value of the resonant frequency can be improved.

(10) When σ represents the standard deviation of $f_0$ of a plurality of multilayer resonant circuit components housed in a packaging member, 5σ can be made to be less than or equal to around 5% of $f_0$.

In addition, the above-described embodiment may be modified as follows.

An electrode layer in which only a capacitor pattern is provided may be added to the multilayer body in addition to the electrode layers in which both coil patterns and capacitor patterns are provided.

An electrode layer in which only a coil pattern is provided may be added to the multilayer body in addition to the electrode layers in which both coil patterns and capacitor patterns are provided.

A decision may be made as to whether add an electrode layer in which only a capacitor pattern is provided or an electrode layer in which only a coil pattern is provided after forming electrode layers in which both a coil pattern and a capacitor pattern are provided and checking the variations in the inductance and the capacitance obtained with these electrode layers.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A multilayer resonant circuit component comprising:
a multilayer body in which first electrode layers that each include both a coil pattern and a capacitor pattern that form an LC resonant circuit are stacked with a first insulator layer interposed therebetween;
wherein at least one of the following is stacked together with a second insulator layer:
at least one second electrode layer that includes only a capacitor pattern located at a position facing the capacitor patterns of the first electrode layers, and
a third electrode layer that includes only a coil pattern, which is electrically connected to the coil patterns of the first electrode layers, and
wherein the at least one second electrode layer includes a plurality of the second electrode layers, and shapes of the capacitor patterns of the plurality of second electrode layers are different from each other.

2. A packaged multilayer resonant circuit component comprising:
the multilayer resonant circuit component according to claim 1; and
a packaging member that houses the multilayer resonant circuit component;
wherein when $f_0$ represents an average value of resonant frequencies of a plurality of the multilayer resonant circuit components and σ represents a standard deviation, 5σ is less than or equal to around 5% of $f_0$.

3. The multilayer resonant circuit component according to claim 1, wherein the shapes of the capacitor patterns of the plurality of second electrode layers are different from a shape of the capacitor patterns of the first electrode layers.

4. The multilayer resonant circuit component according to claim 3, wherein a thickness of the second insulator layer is around 5 µm to 15 µm.

5. The multilayer resonant circuit component according to claim 3, wherein a ratio of a thickness of at least one of the plurality of second electrode layers to a thickness of the second insulator layer, or a ratio of a thickness of the third electrode layer to a thickness of the second insulator layer, is set to be in a range of 0.3 to 4.0.

6. The multilayer resonant circuit component according to claim 1, wherein a ratio of a thickness at least one of the plurality of second electrode layers to a thickness of the second insulator layer, or a ratio of a thickness of the third electrode layer to a thickness of the second insulator layer, is set to be in a range of 0.3 to 4.0.

7. The multilayer resonant circuit component according to claim 1, wherein a thickness of the second insulator layer is around 5 μm to 15 μm.

8. The multilayer resonant circuit component according to claim 1, wherein a thickness of the second insulator layer is different from a thickness of the first insulator layer interposed between the first electrode layers.

9. The multilayer resonant circuit component according to claim 8, wherein the shapes of the capacitor patterns of the plurality of second electrode layers are different from a shape of the capacitor patterns of the first electrode layers.

10. The multilayer resonant circuit component according to claim 8, wherein a ratio of a thickness of at least one of the plurality of second electrode layers to the thickness of the second insulator layer, or a ratio of a thickness of the third electrode layer to the thickness of the second insulator layer, is set to be in a range of 0.3 to 4.0.

11. The multilayer resonant circuit component according to claim 8, wherein
the first to third electrode layers each further include a pair of outer conductor patterns that are commonly exposed to at least one surface of the multilayer body,
the pair of outer conductor patterns are substantially L shaped when viewed in a stacking direction of the multilayer body and are electrically connected to each other to form outer conductors,
the coil patterns of the first and third electrode layers are electrically connected to each other and form a coil conductor having a coil axis that is substantially parallel to the at least one surface of the multilayer body, and
the outer conductors are electrically connected to end portions of the coil conductor and to the capacitor patterns.

12. The multilayer resonant circuit component according to claim 8, wherein the thickness of the second insulator layer is around 5 μm to 15 μm.

13. The multilayer resonant circuit component according to claim 1, wherein
the first to third electrode layers each further include a pair of outer conductor patterns that are commonly exposed to at least one surface of the multilayer body,
the pair of outer conductor patterns are substantially L shaped when viewed in a stacking direction of the multilayer body and are electrically connected to each other to form outer conductors,
the coil patterns of the first and third electrode layers are electrically connected to each other and form a coil conductor having a coil axis that is substantially parallel to the at least one surface of the multilayer body, and
the outer conductors are electrically connected to end portions of the coil conductor and to the capacitor patterns.

14. A multilayer resonant circuit component comprising:
a multilayer body in which first electrode layers that each include both a coil pattern and a capacitor pattern that form an LC resonant circuit are stacked with a first insulator layer interposed therebetween;
wherein at least one of the following is stacked together with a second insulator layer:
at least one second electrode layer that includes only a capacitor pattern located at a position facing the capacitor patterns of the first electrode layers, and
a third electrode layer that includes only a coil pattern, which is electrically connected to the coil patterns of the first electrode layers,
wherein
the first to third electrode layers each further include a pair of outer conductor patterns that are commonly exposed to at least one surface of the multilayer body,
the pair of outer conductor patterns are substantially L shaped when viewed in a stacking direction of the multilayer body and are electrically connected to each other to form outer conductors,
the coil patterns of the first and third electrode layers are electrically connected to each other and form a coil conductor having a coil axis that is substantially parallel to the at least one surface of the multilayer body, and
the outer conductors are electrically connected to end portions of the coil conductor and to the capacitor patterns.

15. A packaged multilayer resonant circuit component comprising:
a multilayer resonant circuit component comprising:
a multilayer body in which first electrode layers that each include both a coil pattern and a capacitor pattern that form an LC resonant circuit are stacked with a first insulator layer interposed therebetween;
wherein at least one of the following is stacked together with a second insulator layer:
at least one second electrode layer that includes only a capacitor pattern located at a position facing the capacitor patterns of the first electrode layers, and
a third electrode layer that includes only a coil pattern, which is electrically connected to the coil patterns of the first electrode layers; and
a packaging member that houses the multilayer resonant circuit component;
wherein when $f_0$ represents an average value of resonant frequencies of a plurality of the multilayer resonant circuit components and σ represents a standard deviation, 5σ is less than or equal to around 5% of $f_0$.

16. A multilayer resonant circuit component manufacturing method comprising:
stacking first electrode layers, which each include both a coil pattern and a capacitor pattern that form an LC resonant circuit, with a first insulator layer interposed therebetween;
stacking, together with a second insulator layer, at least one of:
a second electrode layer that includes only a capacitor pattern, and
a third electrode layer that includes only a coil pattern, which is electrically connected to the coil patterns of the first electrode layers; and
adjusting at least one of:
a capacitance of a capacitor formed by the capacitor pattern of the second electrode layer, an inductance of a coil formed by the third electrode layer, and a thickness of the second insulator layer, so as to cancel out a variation amount of an inductance of the coil patterns of the first electrode layers and a variation amount of a capacitance generated by the capacitor patterns of the first electrode layers arising from variations in processing of the first electrode layers and the first insulating layer.

* * * * *